(12) United States Patent
Thrap

(10) Patent No.: US 6,614,231 B2
(45) Date of Patent: Sep. 2, 2003

(54) HIGH EFFICIENCY ELECTRONIC LOAD

(75) Inventor: Guy C. Thrap, Del Mar, CA (US)

(73) Assignee: Maxwell Technologies, Inc., San Diego, CA (US)

( * ) Notice: Subject to any disclaimer, the term of this patent is extended or adjusted under 35 U.S.C. 154(b) by 0 days.

(21) Appl. No.: 09/935,773

(22) Filed: Aug. 21, 2001

(65) Prior Publication Data

US 2003/0038636 A1 Feb. 27, 2003

(51) Int. Cl.[7] ............................................... G01R 31/02
(52) U.S. Cl. ......................................................... 324/416
(58) Field of Search ............................. 363/34, 37, 44; 324/119, 120, 134, 415, 416

(56) References Cited

U.S. PATENT DOCUMENTS

| | | | |
|---|---|---|---|
| 4,780,917 A | * 11/1988 | Hancock | 4/544 |
| 5,008,801 A | 4/1991 | Glennon | 363/141 |
| 5,311,419 A | * 5/1994 | Shires | 363/65 |
| 5,602,462 A | * 2/1997 | Stich et al. | 323/258 |
| 5,686,806 A | * 11/1997 | Hibbard | 318/800 |
| 5,691,890 A | * 11/1997 | Hyde | 363/89 |
| 5,905,647 A | 5/1999 | Shirai | 363/132 |
| 6,219,623 B1 | 4/2001 | Wills | 702/60 |
| 6,222,746 B1 | 4/2001 | Kim | 363/89 |

\* cited by examiner

Primary Examiner—Safet Metjahic
Assistant Examiner—Etienne P. LeRoux
(74) Attorney, Agent, or Firm—Foley & Lardner

(57) ABSTRACT

A high efficiency electronic load has a switch mode power factor corrected (PFC) input rectifier circuit that provides a high voltage positive and negative direct current (DC) voltage to drive a switching inverter that in turn delivers an output alternating current (AC) back into an AC power line. The input PFC circuit is phase and frequency controlled by the input AC power line which allows the input and output to be operating at completely different frequencies.

20 Claims, 4 Drawing Sheets

HIGH EFFICIENCY ELECTRONIC LOAD

BACKGROUND

The present invention relates to electronic loads, and more particularly to high efficiency electronic loads.

Historically, when loads are applied to power sources, such as for testing purposes, resistive loads are employed for a test period. When power is applied to the loads (such as load resistors or electronic loads used for testing power supplies) the power is dissipated in the form of heat. Because the dissipated power (i.e., the heat) is generally not employed for any useful purpose, the dissipated power is generally wasted, i.e., expended in the process of powering the resistive load.

For example, to provide a test load for a 15,000 Watt power supply 15,000 Watts of power is wasted for whatever test period that is employed. Saving or partially saving this wasted power would provide a significant savings, which may realistically result in the cost of a more efficient, i.e., less wasteful, electronic load unit being recovered each and every year after deployment.

What is needed, therefore, is a high efficiency electronic load for use in applications, such as power supply testing, that reduces power waste and thereby reduces costs.

The present invention addresses the needs above as well as others.

SUMMARY OF THE INVENTION

The present invention addresses the above and other needs by providing a high efficiency electronic load comprising a switch mode power factor corrected input rectifier circuit that receives an alternating current voltage input and produces a high voltage positive and negative direct current voltage output. A high frequency switching inverter has an input coupled to the high voltage positive and negative direct current voltage output and produces an alternating current output. An output filter has an input coupled to the alternating current output and removes high frequency switching noise and delivers alternating current power back to an input alternating current power line of a unit under test, thereby increasing the efficiency of the high efficiency electronic load over the efficiency achieved by (for example) a resistive load.

BRIEF DESCRIPTION OF THE DRAWINGS

The above and other aspects, features and advantages of the present invention will be more apparent from the following more particular description thereof, presented in conjunction with the following drawings wherein.

DETAILED DESCRIPTION OF THE PREFERRED EMBODIMENTS

The following description is of the best mode presently contemplated for carrying out the invention. This description is not to be taken in a limiting sense, but is made merely for the purpose of describing the general principals of the invention. The scope of the invention should be determined with reference to the claims.

Figure 1:
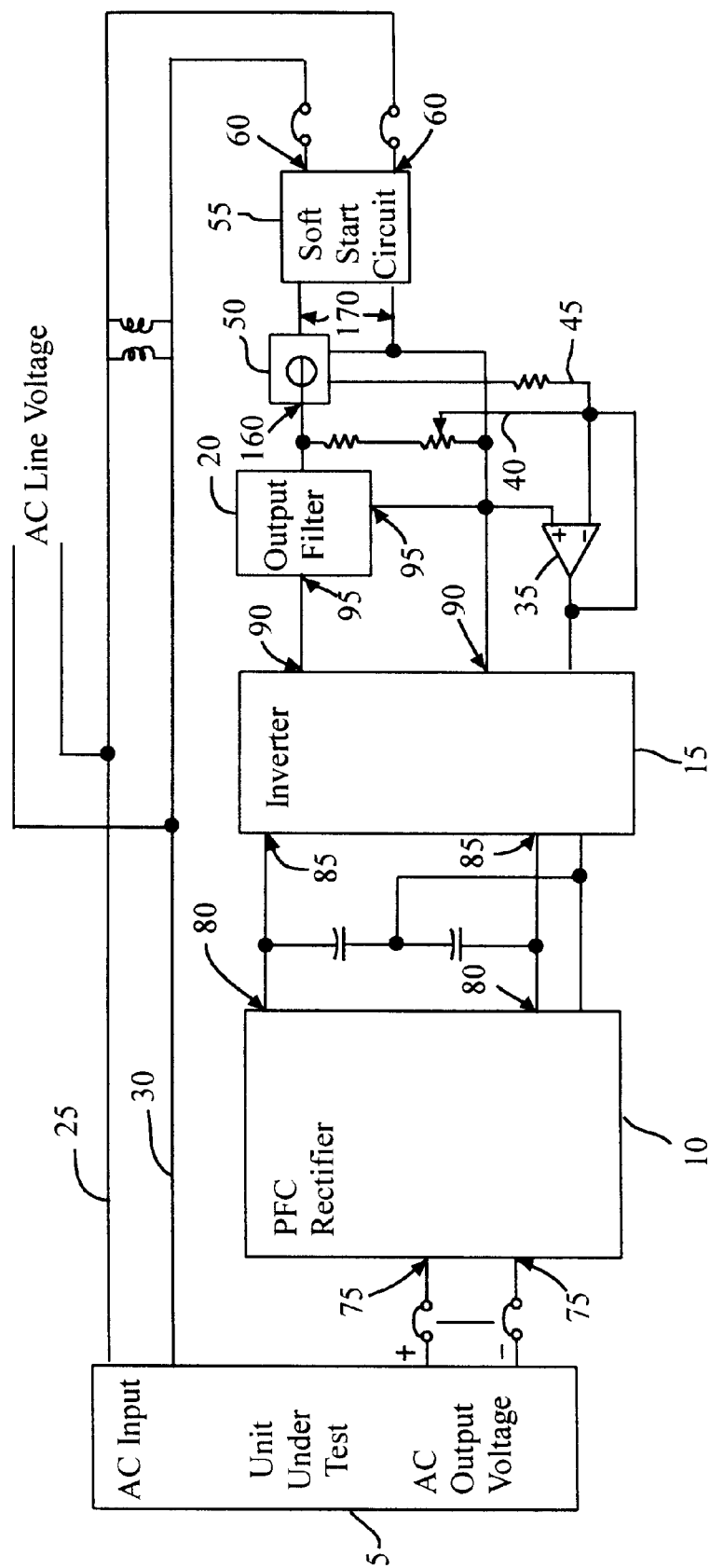
FIG. 1 is a simplified diagram of a high efficiency electronic load with an alternating current input in accordance with the invention.

Referring to FIG. 1, shown is a simplified diagram of a high efficiency electronic load (HEEL) with an alternating current AC input. A switch mode power factor corrected (PFC) input rectifier circuit 10 receives an AC voltage input 75 and produces a high voltage positive and negative direct current (DC) voltage output 80. A high frequency switching inverter 15 has an input 85 coupled to the high voltage positive and negative DC voltage output 80 and produces an AC output 90. An output filter 20 has an input 95 coupled to the AC output 90, and removes high frequency switching noise and delivers AC power 60 through a current sensor 50 and soft start circuit 55 to an input AC power line 25, 30 of a unit under test (UUT) 5.

Figure 2:
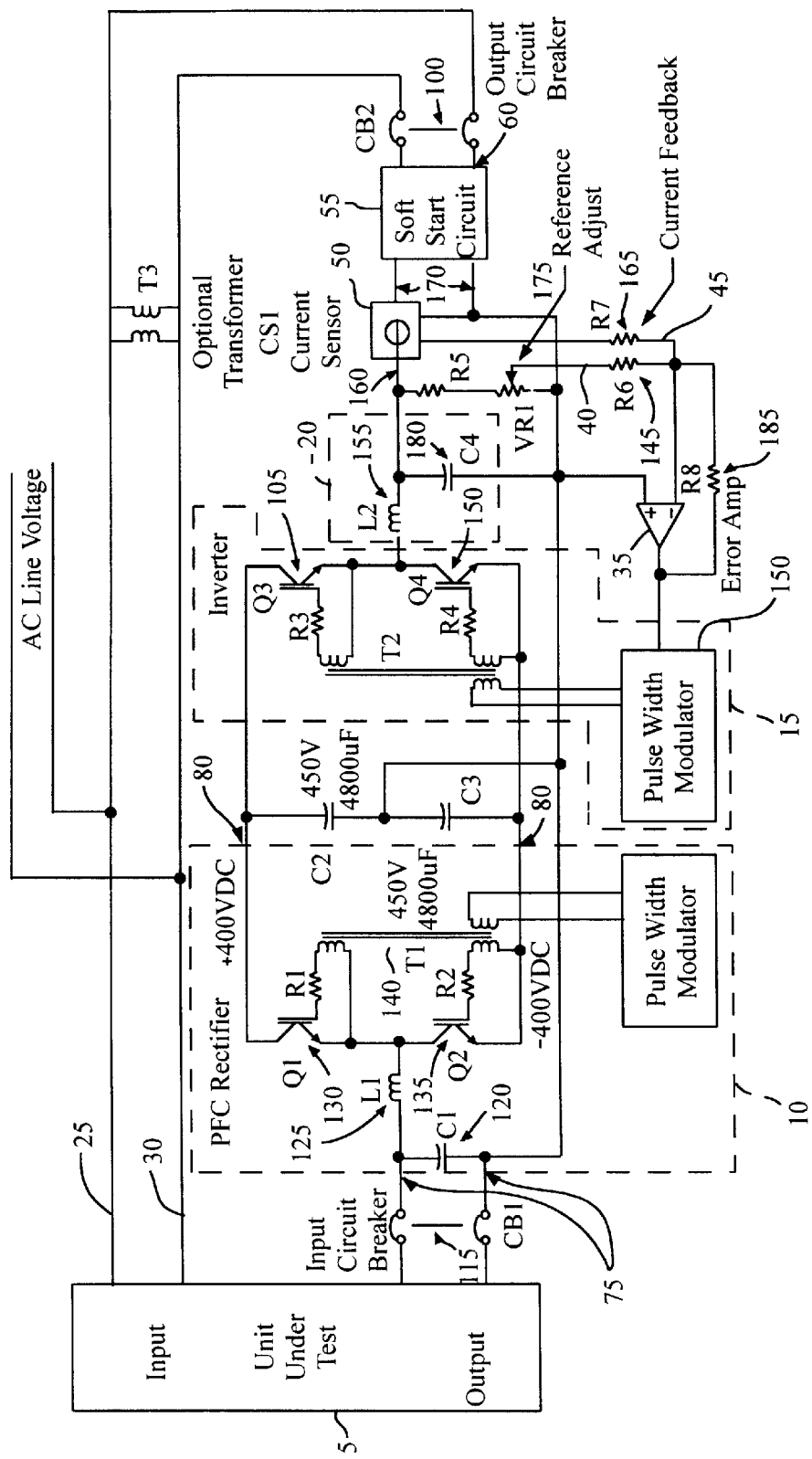
FIG. 2 is a more detailed schematic diagram of the high efficiency electronic load of FIG. 1.

Referring now to FIG. 2, shown is a more detailed schematic diagram of the high efficiency electronic load of FIG. 1. The PFC input rectifier circuit 10 is phase and frequency controlled by the input AC power line 75, which allows the input and output to be operating at completely different frequencies.

The AC line voltage is applied to the output of the HEEL through circuit breaker CB2 100. The soft start circuit 55 will slowly charge up the positive and negative DC rail voltages (Q3 col 105 and Q4 emit 110). Power is applied to the UUT 5 through the AC input 25, 30 which in turn applies its AC output voltage 75 to the HEEL through input through circuit breaker CB1 115. C1 120, L1 125, Q1 130, Q2 135, T1 140 and associated circuitry comprise a high frequency switch mode power factor corrected input rectifier circuit 10. This circuit 10 draws sine wave current from the UUT 5 and boosts it up to + and − DC voltage to drive the inverter 15. Example DC rail 80 voltages are + and − 200 volts DC, and + and − 400 volts DC, and example AC line voltage is 220 volts AC.

The output error amplifier 35 takes in a variable reference voltage 40 through R6 145. The error amplifier 35 drives the output pulse width modulator 150, which in turn causes the inverter 15 to increase the output current through the output inductor L2 155. The output current 160 is sensed by the current sensor CS1 50 and fed back 45 through R7 165 to the error amplifier 35. The current feedback 45 cancels the reference voltage applied to the error amplifier 35. This produces an output current 170 that is proportional to the reference setting 175. For simplicity, the reference adjustment is shown as a potentiometer 175. Preferably, it is a microprocessor-controlled digital attenuator.

L2 155 and C4 180 comprise a filter 20 for the output current to remove the high frequency switching noise. R8 185 sets the open loop gain of the error amplifier 35.

Figure 3:
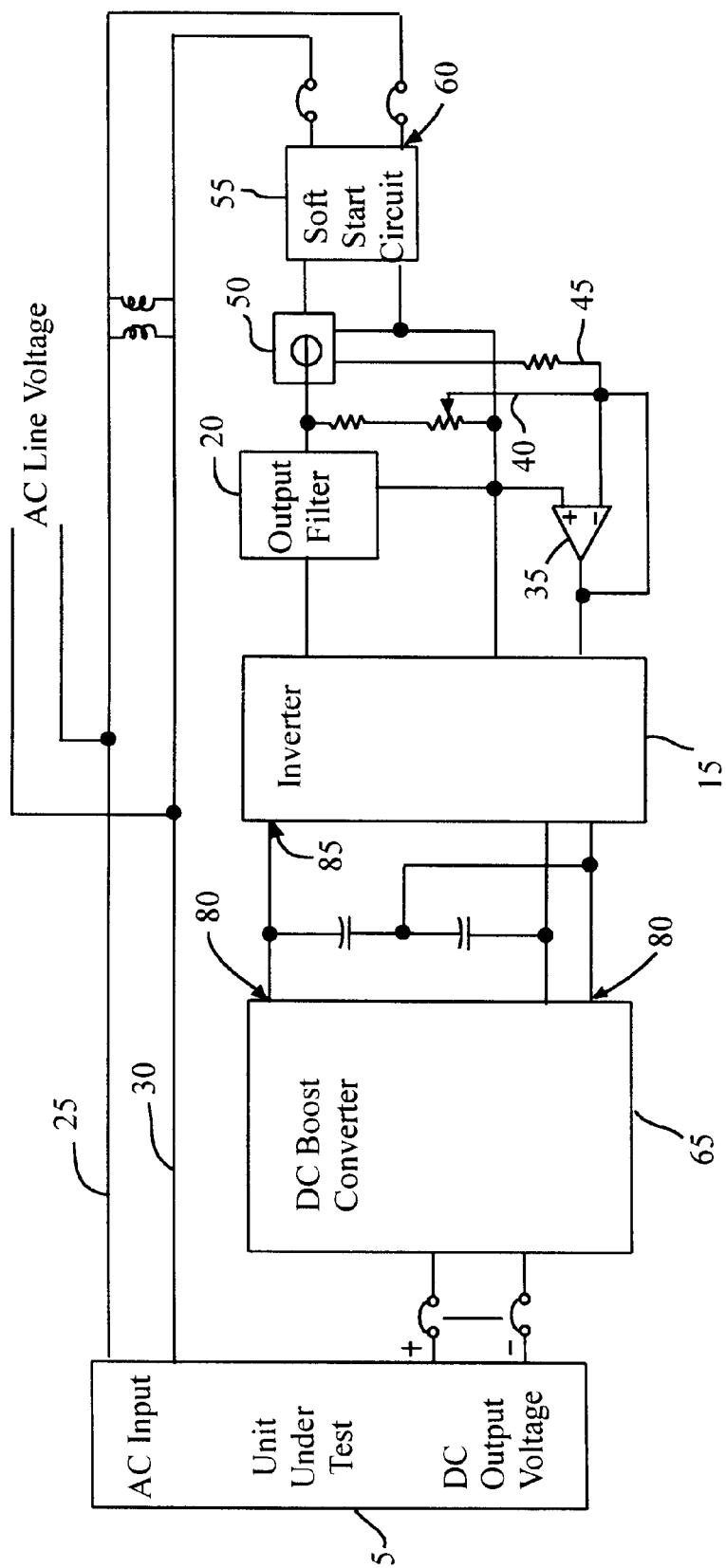
FIG. 3 is a simplified schematic diagram of a high efficiency electronic load with a direct current input in accordance with the invention.

Referring now to FIG. 3, shown is a simplified schematic diagram of a high efficiency electronic load with a direct current input. The only difference between the AC and DC HEEL is the input converter 65. The AC input HEEL, as shown in FIG. 1, uses a switch mode power factor corrected input rectifier 10. The DC input HEEL uses a DC interleaved dual boost converter 65, as shown in FIG. 3.

Figure 4:
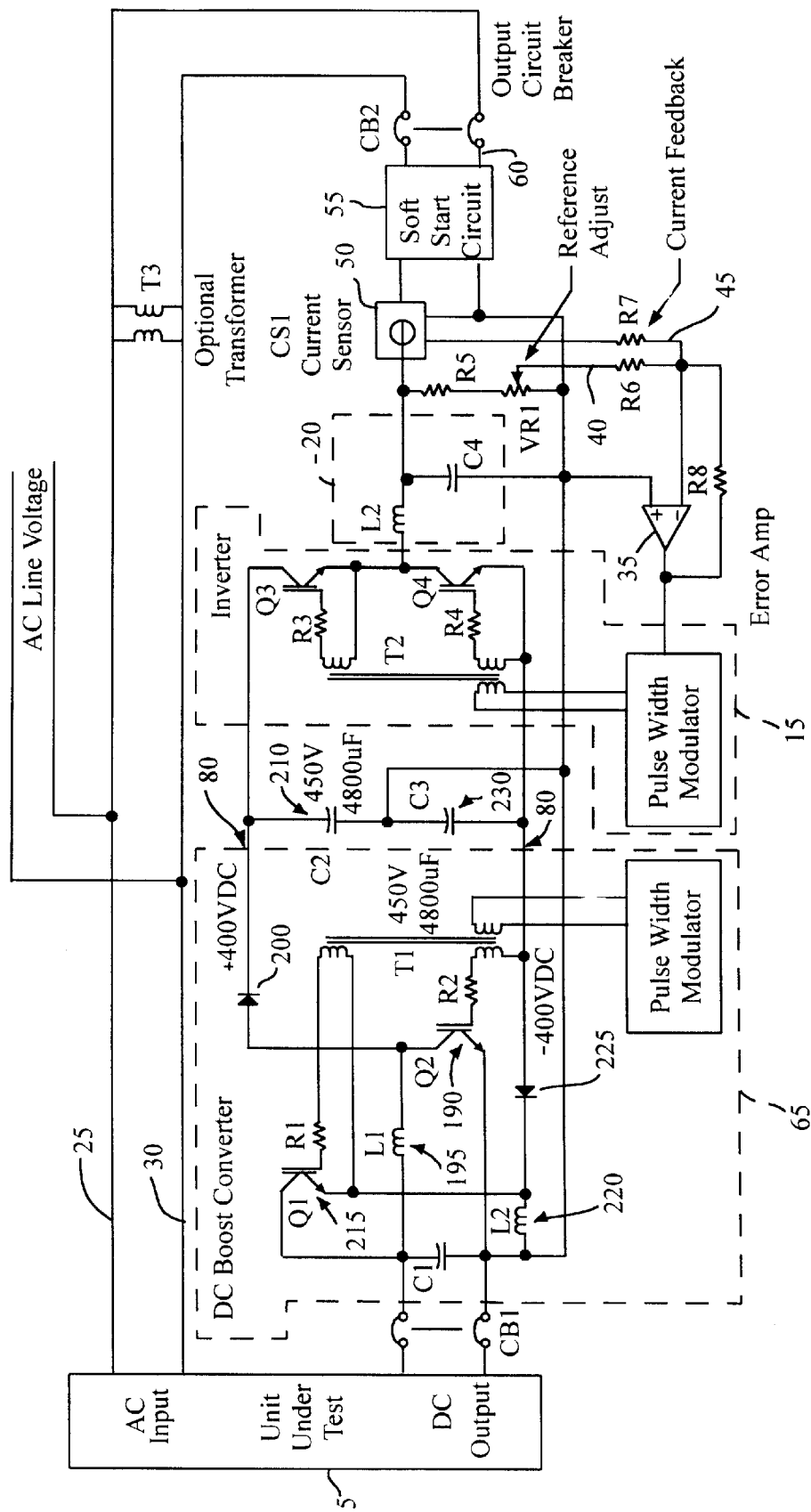
FIG. 4 is a more detailed schematic diagram of the high efficiency electronic load of FIG. 3.

Referring now to FIG. 4, shown is a more detailed schematic diagram of the high efficiency electronic load of FIG. 3. Within the interleaved DC boost converter 65, Q2 190 is turned on to build current flow in L1 195. Q2 190 is then turned off and the stored energy in L1 195 forward biases the diode 200 that connects to the positive 400 volt DC rail 80. The stored energy in L1 195 is then transferred to C2 210. Q1 215 is turned on to build current flow in L2 220. Q1 215 is then turned off and the stored energy in L2 220 flows through a connecting diode 225 and into C3 230. Q1 215 and Q2 190 are alternately turned on and off in an interleaving fashion to maintain a more constant input current from the UUT.

Controlling the on time of Q1 215 and Q2 190 regulates the positive and negative 400 volt DC rails 80. The duty cycle of Q1 215 and Q2 190 operates within the range of zero to 50% duty cycle.

While the invention herein disclosed has been described by means of specific embodiments and applications thereof, numerous modifications and variations could be made thereto by those skilled in the art without departing from the scope of the invention set forth in the claims.

What is claimed is:

1. A high efficiency electronic load comprising:
   a switch mode power factor corrected input rectifier circuit that receives an alternating current voltage input and produces a high voltage positive and negative direct current voltage output;
   a high frequency switching inverter having an input coupled to the high voltage positive and negative direct current voltage output and for producing an alternating current output; and
   an output filter having an input coupled to the alternating current output and for removing high frequency switching noise and delivering an alternating current power to an input alternating current power line of a unit under test.

2. The high efficiency electronic load according to claim 1 further comprising means electrically coupled to the high frequency switching inverter for providing a programmable constant power load on the unit under test.

3. The high efficiency electronic load according to claim 1 further comprising a transformer electrically coupled to the alternating current voltage input for changing the amplitude of the alternating current voltage input and for providing electrical isolation between the unit under test and inverter.

4. The high efficiency electronic load according to claim 1 further comprising a transformer electrically coupled to the output filter for changing the amplitude of the alternating current power from the output filter and providing electrical isolation between the inverter and the input alternating current power line of the unit under test.

5. The high efficiency electronic load according to claim 4 further comprising a transformer electrically coupled to the alternating current voltage input for changing the amplitude of the alternating current voltage input and for providing electrical isolation between the unit under test and inverter.

6. A method for providing an electronic load to a unit under test comprising:
   receiving an alternating current voltage input from an alternating current output of a unit under test;
   producing a high voltage positive and negative direct current voltage output from the alternating current voltage input;
   producing an alternating current output from the high voltage positive and negative direct current that is phase synchronized with a line voltage of an alternating current input of the unit under test;
   filtering the alternating current output to remove high frequency switching noise; and
   applying the alternating current output to the alternating current input line of the unit under test.

7. The method according to claim 6 further comprising the step of programming a constant power or constant current load on the unit under test.

8. The method according to claim 6 further comprising the step of selectively changing the amplitude of the alternating current voltage input.

9. The method according to claim 6 further comprising the step of selectively changing the amplitude of the alternating current output to be applied to the alternating current input line of the unit under test.

10. The method according to claim 9 further comprising the step of selectively changing the amplitude of the alternating current voltage input.

11. A high efficiency electronic load comprising:
    a switch mode input circuit that receives a direct current input voltage and produces positive and negative direct current voltage output;
    a high frequency switching inverter having an input coupled to the high voltage positive and negative direct current voltage output and for producing an alternating current output; and
    an output filter having an input coupled to the alternating current output and for removing high frequency switching noise and delivering an alternating current power to an input alternating current power line of a unit under test.

12. The high efficiency electronic load according to claim 11 further comprising means electrically coupled to the high frequency switching inverter for providing a programmable constant power or constant current load on the unit under test.

13. The high efficiency electronic load according to claim 11 further comprising a transformer electrically coupled to the output filter for changing the amplitude of the alternating current power from the output filter and providing electrical isolation between the inverter and the input alternating current power line of the unit under test.

14. A method for providing an electronic load to a unit under test comprising:
    receiving a direct current voltage input from a direct current output of a unit under test;
    producing a high voltage positive and negative direct current voltage output from the direct current voltage input;
    producing an alternating current output from the high voltage positive and negative direct current that is phase synchronized with a line voltage of an alternating current input of the unit under test;
    filtering the alternating current output to remove high frequency switching noise; and
    applying the alternating current output to the alternating current input line of the unit under test.

15. The method according to claim 14 further comprising the step of programming a constant power load on the unit under test.

16. The method according to claim 14 further comprising the step of selectively changing the amplitude of the direct current voltage input.

17. The method according to claim 14 further comprising the step of selectively changing the amplitude of the alternating current output to be applied to the alternating current input line of the unit under test.

18. The method according to claim 17 further comprising the step of selectively changing the amplitude of the alternating current voltage input.

19. A high efficiency electronic load, comprising:

a switch mode power factor corrected input rectifier circuit that receives an alternating current voltage input from a unit under test and produces a positive and negative direct current voltage output;

a high frequency switching inverter having an input coupled to the positive and negative direct current voltage output and for producing an alternating current output; and an output filter having an input coupled to the alternating current output of the inverter and for removing high-frequency switching noise and delivering an alternating current power;

wherein the alternating current power of the filter is delivered to an input line of the unit under test.

20. A high efficiency electronic load, comprising:

a switch mode input circuit that receives a direct current voltage input from a unit under test and produces a positive and negative direct current voltage output;

a high frequency switching inverter having an input coupled to the positive and negative direct current voltage output and for producing an alternating current output; and an output filter having an input coupled to the alternating current output of the inverter and for removing high-frequency switching noise and delivering an alternating current power;

wherein the alternating current power of the filter is delivered to an input line of the unit under test.

* * * * *